(12) United States Patent
Vukojevic et al.

(10) Patent No.: US 9,318,920 B2
(45) Date of Patent: Apr. 19, 2016

(54) METHOD AND SYSTEM FOR THE INSTALLATION OF FAULT CIRCUIT INDICATORS ON AN ELECTRICAL FEEDER

(75) Inventors: Aleksandar Vukojevic, Reisterstown, MD (US); Paul Frey, Perry Hall, MD (US)

(73) Assignee: BALTIMORE GAS AND ELECTRIC COMPANY, Baltimore, MD (US)

( * ) Notice: Subject to any disclaimer, the term of this patent is extended or adjusted under 35 U.S.C. 154(b) by 982 days.

(21) Appl. No.: 13/486,210

(22) Filed: Jun. 1, 2012

(65) Prior Publication Data
US 2013/0325402 A1    Dec. 5, 2013

(51) Int. Cl.
G01R 31/08    (2006.01)
H02J 13/00    (2006.01)

(52) U.S. Cl.
CPC .............. *H02J 13/001* (2013.01); *G01R 31/086* (2013.01); *Y04S 10/40* (2013.01); *Y04S 10/522* (2013.01)

(58) Field of Classification Search
CPC .............................. H02J 13/001; G01R 31/086
See application file for complete search history.

(56) References Cited

U.S. PATENT DOCUMENTS

| | | |
|---|---|---|
| 6,996,483 B2 | 2/2006 | Parsons et al. |
| 7,400,150 B2 | 7/2008 | Cannon et al. |
| 7,532,955 B2 | 5/2009 | Dougherty |
| 7,692,538 B2 | 4/2010 | Schweitzer et al. |
| 7,853,417 B2 | 12/2010 | Vaswani et al. |
| 7,877,624 B2 | 1/2011 | Park et al. |
| 7,930,141 B2 | 4/2011 | Banting et al. |
| 7,969,155 B2 | 6/2011 | Varghai et al. |
| 8,000,913 B2 | 8/2011 | Kreiss et al. |
| 8,065,099 B2 | 11/2011 | Gibala et al. |
| 2010/0152910 A1* | 6/2010 | Taft .............................. 700/286 |
| 2010/0217546 A1 | 8/2010 | Locker |
| 2011/0077790 A1 | 3/2011 | Vaswani et al. |
| 2011/0166716 A9 | 7/2011 | Rovnyak et al. |
| 2011/0208366 A1 | 8/2011 | Taft et al. |

OTHER PUBLICATIONS

Xu et al., "Observability Analysis and Measurement Placement for Systems with PMUs", 2004, Power Systems Conference and Exposition, 2004. IEEE.*
Michaelson et al., "Using CAIDI as a Leading Indicator", Mar. 1, 2008, Electric Light and Power, vol. 86, Issue 2, http://www.elp.com/articles/print/volume-86/issue-2/sections/td/using-caidi-as-a-leading-indicator.html.*
IEEE Standard 1366-2003, "IEEE Guide for Electric Power Distribution Reliability Indices", IEEE May 14, 2004.*
Almeida, M.C. de, et al. "Optimal placement of faulted circuit indicators in power distribution systems." Electric Power Systems Research. vol. 81. 2011. pp. 699-706.

(Continued)

*Primary Examiner* — Regis Betsch
(74) *Attorney, Agent, or Firm* — Whiteford, Taylor & Preston, LLP; Gregory M Stone

(57) ABSTRACT

A method for maximizing the benefits of Fault Circuit Indicators on an electrical feeder has two steps. In the first step a data set for the feeder is obtained based on historical data. In the second step, the number of FCIs and their location is calculated based on the data set obtained in the first step. The number of FCIs and their location is determined utilizing a simulation algorithm that ensures each FCI is used efficiently and provides actionable information to the utility's crew.

26 Claims, 2 Drawing Sheets

(56) References Cited

OTHER PUBLICATIONS

Cong, Duc-Pham, et al. "Optimization of fault indicators placement with dispersed generation insertion." Power Engineering Society General Meeting. vol. 1. 2005. pp. 355-362.

Falaghi, et al. "Fault Indicators Effects on Distribution Reliability Indices." 18th International Conference on Electricity Distribution. Turin, Jun. 6-9, 2005. 4 pages.

Ho, Chin-Ying. "Optimal Placement of Fault Indicators Using the Immune Algorithm." IEEE Transactions on Power Systems. vol. 26, No. 1. Feb. 2011. pp. 38-45.

Souza, D.M.B.S. de, et al. "Efficient Fuzzy Approach for Allocating Fault Indicators in Power Distribution Lines." Transmission and Distribution Conference and Expostion: Latin America. Aug. 13-15, 2008. 6 pages.

* cited by examiner

METHOD AND SYSTEM FOR THE INSTALLATION OF FAULT CIRCUIT INDICATORS ON AN ELECTRICAL FEEDER

BACKGROUND

1. Field of the Invention

The invention disclosed herein relates generally to fault circuit indicators ("FCIs") and more particularly to methods, systems, and processes to maximize the benefits of FCIs on an electrical distribution network.

2. Background of the Invention

FCIs have been part of electrical utility distribution networks for few decades. After the fault occurrence, utility personnel normally patrol and inspect the FCIs for visual identification that the fault has been detected by the devices. The majority of the existing FCIs installed during the past few decades did not have any communication device associated with them. Thus, the utility's back office did not have any indication of the location of a fault until the crew visually inspected every device. In addition, these devices did not differentiate between permanent and temporary faults.

The advances in technology and communications have resulted in development of new FCIs with advanced capabilities. Today, FCIs are designed as low-cost sensing devices, which are easily deployed on the utility's power system network. These devices can be easily installed on the power lines by using a standard hot stick, which locks them into place. This is a very desirable feature, because it allows sensors to be easily removed for maintenance or for placement at another position. There are several types of FCI devices that are available on the market today, which differ on the amount and type of information that can be sent back to the utility's back office, and in communication networks used to transmit and receive the data.

Remote indication by FCIs that the fault has occurred, and that a particular FCI has seen the fault, reduces the time it takes a line crew to locate and correct the fault. If the only available information is that the fault has occurred, then a line crew is sent to patrol the areas downstream from the FCI. However, if additional data is available, such as level of fault current and type of fault, power flow software can be used to identify the approximate location of the fault. This procedure can take extra time and in some instances can result in multiple fault locations for the line crew to patrol. As a result, there is a need for a method and system for efficiently placing fault circuit indicators on an electrical grid to reduce the time it takes crews to isolate and repair an electrical fault and associated electrical outages.

SUMMARY

An object of the present invention is to provide a method for maximizing efficient placement of Fault Circuit Indicators (FCIs) on an electrical feeder, comprising the steps of obtaining a data set associated with faults on an electrical feeder (wherein said data set includes overhead and underground fault response information) and identifying the number of FCIs and a location of each FCI on the feeder utilizing information contained in the data set. The information contained in the data set includes, but is not limited to, at least one of overhead, underground fault response information, and probabilities of overhead and underground faults in the feeder, wherein said number of FCIs and location each FCI results in a reduction of customer average outage time (AOT) for the feeder.

Another object of the present invention is to provide a computer program product comprising a non-transitory computer readable medium encoding a computer program for executing on a computer system to provide a computer process for maximizing efficient placement of FCIs on an electrical feeder; the computer process executed by the computer system comprises. The compute process executed by the program consists of several steps. The first step is to obtain a data set associated with faults on an electrical feeder, wherein said data set includes overhead and underground fault response information. The second step is to identify a number of FCIs and a location of each FCI on the feeder utilizing information contained in the data set, wherein said information comprises at least one of overhead, underground fault response information, and probabilities of overhead and underground faults in the feeder, wherein said number of FCIs and location each FCI results in a reduction of customer average outage time (AOT) for the feeder.

Another object of the present invention is to provide a system for maximizing efficient placement of Fault Circuit Indicators (FCIs) on an electrical feeder. The system has a data management module configured to store a data set, and a FCI placement module configured to process feeder data and identify a number of FCIs and a location of each FCI on the feeder utilizing information contained in the data set, wherein said information comprises at least one of overhead, underground fault response information, and probabilities of overhead and underground faults in the feeder, wherein said number of FCIs and location each FCI results in a reduction of customer average outage time (AOT) for the feeder.

BRIEF DESCRIPTION OF THE DRAWINGS

The above and other features, aspects, and advantages of the present invention are considered in more detail, in relation to the following description of embodiments thereof shown in the accompanying drawings, in which.

DESCRIPTION OF PREFERRED EMBODIMENTS

The invention summarized above may be better understood by referring to the following description, which should be read in conjunction with the accompanying drawings and claims. This description of an embodiment, set out below to enable one to practice an implementation of the invention, is not intended to limit the preferred embodiment, but to serve as a particular example thereof. Those skilled in the art should appreciate that they may readily use the conception and specific embodiments disclosed as a basis for modifying or designing other methods and systems for carrying out the same purposes of the present invention. Those skilled in the art should also realize that such equivalent assemblies do not depart from the spirit and scope of the invention in its broadest form.

Figure 1:
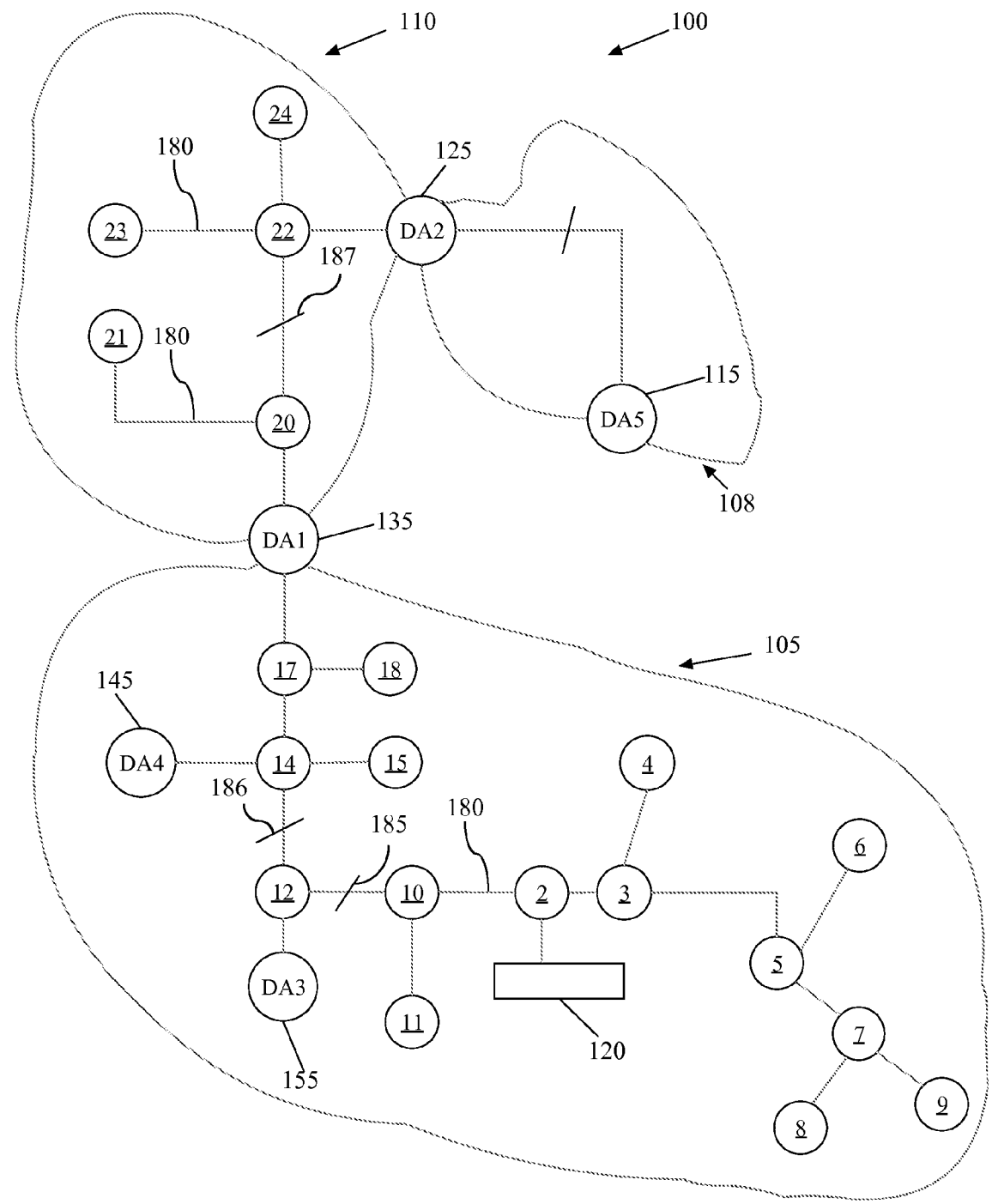
FIG. 1 is a graphical representation of an electrical feeder without any FCI's installed.

As provided in this application, an "electrical distribution network" is a system comprising a series of elements that facilitate delivery of electricity to consumers. The elements of the electrical distribution network include distribution substations, feeders, distribution lines, utility poles, switches, and other components known to a person of ordinary skill in the art. Distribution substation 120 usually consists of several feeders. A "feeder" is a section of the electrical distribution network and an example is shown in FIG. 1. The feeder 100 has distribution lines 180 that connect various nodes, numbered 2 through 24. Customer load is located between these nodes. The feeder further comprises Distribution Automation (DA) reclosers 115, 125, 135, 145, and 155, and manually operated switches 185, 186, and 187.

When a fault occurs on an electrical distribution network, protection and control devices (such as relays, reclosers, sectionalizers, and fuses) operate in order to isolate the fault. Electrical distribution networks can have from zero to several hundred feeders 100 with DA reclosers 115, 125, 135, 145, and 155 capable of automatically reconfiguring a circuit and minimizing the number of people affected by the associated electrical outage (this application is called FDIR—Fault Detection, Isolation and Restoration or FLISR—Fault Location, Isolation, and System Restoration). After the fault occurs, DA reclosers 115, 125, 135, 145, and 155 automatically reconfigure the feeder, a fault ticket is created in the system and a work order for a line crew is initiated. The line crew is alerted and begins to patrol the feeder until the fault has been localized and repaired. After the fault has been repaired, the feeders are switched back to their normal configuration.

In one exemplary embodiment, each feeder is divided into zones 105, 108, and 110, where zone boundaries are determined by the location of DA reclosers. If the feeder 100 has no DA reclosers, then it is considered to be a single zone feeder. Each zone is divided in sections, with each section being a line 180 between two nodes. Sections are characterized by the following values:
 a. number of miles of overhead/underground cable,
 b. number of customers,
 c. number of protective devices (reclosers, switches, etc. . . . ),
 d. power consumed.

After the fault initially occurs, the DA reclosers 115, 125, 135, 145, and 155 isolate the zone where the fault has occurred, by opening a particular DA device or devices and sending a message to the utility's back office. The circuit is then reconfigured by automatic switching of other available DA devices, so that the power is restored to the two zones without the fault. After the fault is localized to a particular zone, and the line crew has located the fault within the zone affected by the fault, the crew determines if there is any upstream manually operated switch 185, 186, 187 that can be opened, so additional customers from the zone affected by the fault can be restored prior to the crew repairing the fault. For example, if the fault is in zone 1 between nodes 10 and 11, the line crew can go to line switch 185 and open the switch, and then close DA1, DA4 or DA3 in order to bring back service to customers from zone 1, on the left side of the switch. Automatic feeder configuration significantly reduces the time it takes to patrol the circuits and locate the fault.

Not all feeders have this type of FDIR scheme. For example, reclosers and sectionalizers in some feeders on the circuit do not have communication with the utility's back office. The DA devices 115, 125, 135, 145, and 155 isolate the customers by switching particular sections of the feeder on or off. As soon as the fault occurs, and one of these reclosers has operated, calls from the customers affected by the outage alert the utility of the fault, and based on the location of the customers calling, the utility's Outage Management System (OMS) analysis is used to identify which area (downstream of the particular recloser or other protective device) is affected by the outage and where the fault might have happened.

Feeder section characteristic values are shown in Table 1:

TABLE 1

Feeder Data

| | Feeder values | | | | | |
|---|---|---|---|---|---|---|
| Section | P [kW] | Miles | OH[%] | UG[%] | Customers in section | Customers until EOL |
| 1-2 | 6500 | 0.05 | 0 | 100 | 0 | 80 |
| 2-3 | 2000 | 0.5 | 100 | 0 | 0 | 20 |
| 3-4 | 50 | 0.5 | 5 | 95 | 10 | 10 |
| 3-5 | 1800 | 0.5 | 100 | 0 | 0 | 10 |
| 5-6 | 1250 | 1 | 0 | 100 | 3 | 3 |
| 5-7 | 500 | 0.25 | 100 | 0 | 0 | 7 |
| 7-8 | 400 | 1.5 | 25 | 75 | 5 | 5 |
| 7-9 | 100 | 0.25 | 65 | 35 | 2 | 2 |
| 2-10 | 4500 | 1 | 100 | 0 | 15 | 60 |
| 10-11 | 10 | 4 | 5 | 95 | 10 | 10 |
| 10-12 | 3750 | 0.15 | 100 | 0 | 3 | 35 |
| 12-DA3 | 0 | 0.10 | 100 | 0 | 0 | 0 |
| 12-14 | 3500 | 0.25 | 100 | 0 | 1 | 32 |
| 14-15 | 50 | 0.25 | 100 | 0 | 5 | 5 |
| 14-DA4 | 0 | 0.25 | 100 | 0 | 0 | 0 |
| 14-17 | 3250 | 1.25 | 95 | 5 | 10 | 26 |
| 17-18 | 500 | 1 | 0 | 100 | 16 | 16 |
| 17-DA1 | 2500 | 0.25 | 100 | 0 | 0 | 0 |
| DA1-20 | 2500 | 0.5 | 100 | 0 | 0 | 90 |
| 20-21 | 1250 | 0.25 | 15 | 85 | 75 | 75 |
| 20-22 | 1000 | 3.25 | 95 | 5 | 6 | 15 |
| 22-23 | 100 | 0.5 | 100 | 0 | 7 | 7 |
| 22-24 | 125 | 1 | 50 | 50 | 2 | 2 |
| 22-DA2 | 750 | 0.25 | 100 | 0 | 0 | 25 |
| DA2-DA5 | 750 | 2 | 65 | 35 | 25 | 25 |

Reclosers DA1 125 and DA2 135 are normally closed and they operate as part of FDIR scheme. Reclosers DA3 115, DA4 145 and DA5 155 are normally open, and they are also part of FDIR scheme, supplying power from the alternate feeder during fault condition(s).

A method for maximizing efficient placement of Fault Circuit Indicators (FCIs) on an electrical feeder is described in this application. The first step in the method is to obtain a data set associated with faults on an electrical feeder, wherein said data set includes overhead and underground fault response information. Once the data set is obtained, a number of FCIs and their location on the feeder are determined utilizing information contained in the data set, including overhead and underground fault response information and probabilities of overhead and underground faults in the feeder, as described in more detail below. The number of FCIs and location each FCI results in a reduction of customer Average Outage Time (AOT) for the feeder, which is representative of the Customer Average Interruption Duration Index (CAIDI). In a preferred embodiment, the number of FCIs deployed results in an optimal customer AOT.

The "optimal AOT" described in this application refers to the most efficient AOT. The optimal AOT is the AOT at which deployment of an additional FCI(s) does not result in a decrease in AOT that justifies its deployment. For example, in the exemplary feeder described below the difference between deploying four or five sets of FCIs results in a decrease in AOT of only 0.03 hr. In some embodiments, one set of FCIs consists of three devices (one for each phase) and depending on the design it can also include a gateway for communicating the data to the utility's back office. If the cost of the additional deployment is more than the total benefit realized in the reduction of AOT, then, although the AOT may be lower than with four sets of FCIs, it is not an optimal AOT as it will not result in additional benefit or decrease in costs to the utility and, ultimately, the consumer. In some instances, the utility may select a number of FCIs that corresponds to the lowest AOT to, for example, ensure consumer satisfaction. In other instances, the utility will select the number of FCIs that results in an optimal AOT.

As seen in FIG. 1, the feeder 100 has been divided into three zones ($N_Z$=3) by the DA reclosers DA1 125 and DA2 135. It is contemplated that the feeder can be divided in many different ways in order to isolate a fault and reduce the number of customers affected by a power outage.

One object of the present invention is to minimize the average outage time for each customer on the feeder 100, as defined in [1]:

$$AOT = \frac{\sum_{i=1}^{i=N_Z}\left(\sum_{c=1}^{c=N_{CZi}} COT_{ci} * p_{Zi}\right)}{N_C}$$

where,
AOT—average outage time per customer per feeder,
$COT_{ci}$—outage time for customer c in the zone i,
$p_{Zi}$—probability of the fault in the zone i,
$N_{CZi}$—total number of customers in zone i,
$N_Z$—total number of zones.

The value of AOT, as calculated, is the value that is the representative of the CAIDI. One of the elements that is part of AOT is the customer outage time (COT) for both overhead (OH) and underground (UG) cables, which is calculated as follows:

$$COT_{OH} = WTT_{OH} + CTT_{OH} + CIT_{OH} + CFFT_{OH}$$

$$COT_{UG} = WTT_{UG} + CTT_{UG} + CIT_{UG} + CFFT_{UG}$$

where,
WTT—time to initiate a work ticket, after the fault has occurred,
CTT—time for the line crew to drive from the distribution maintenance center to the particular place along the feeder,
CIT—time to inspect the feeder, and
CFFT—time to fix the fault.
In one exemplary embodiment, historical data is used to generate the values for calculating COT. In addition, the following assumptions are made for further analysis:
$WTT_{OH}$=WTTUG=5 minutes,
$CTT_{OH}$=$CTT_{UG}$=1 hour,
$CFFT_{OH}$=10 hours,
$CFFT_{UG}$=5 hours.
For the CIT, use the following formulas are utilized:

$$CIT_{OH} = T_{OH} * M_{OH},$$

$$CIT_{UG} = T_{UG} * M_{UG},$$

where,
$T_{OH}$—time to inspect the overhead line (15 minutes/mile),
$T_{UG}$—time to inspect the underground line (1.5 hour/mile),
$M_{OH}$—number of overhead cable miles in a particular zone,
$M_{UG}$—number of underground cable miles in a particular zone.

Note that the times selected above are just for illustration purposes only. These times can be different for different feeders, different sections, different types of cable, etc. In order to more accurately calculate the appropriate location for the FCIs, the different percentage of the faults on the overhead and underground cable—$p_{OH\,i}$ and $p_{UG\,i}$—for each zone are determined based on information about the faults per mile for both OH and UG cable. The following values are used for cable failure rates in further analysis:

$$p_{UG} = 0.20 \text{ faults/year/mile}$$

$$p_{OH} = 0.30 \text{ faults/year/mile}$$

The total number of faults that OH and UG cables cause on the feeder is determined by multiplying the $p_{UG}$ and $p_{OH}$ the number of miles of OH and UG cable in a particular zone. From here, $p_{OH\,i}$ and $p_{UG\,i}$ are the ratios of OH and UG faults and the sum of the total faults on the feeder caused by the cable failures. For example, the analysis for the feeder that is shown in FIG. 1 yields the following results:

|  | OH Miles | UG Miles | OH Faults | UG Faults | $p_{OH\,i}$ | $p_{UG\,i}$ |
|---|---|---|---|---|---|---|
| Zone #1 | 5.45 | 7.60 | 1.64 | 1.52 | 0.52 | 0.48 |
| Zone #2 | 4.88 | 0.88 | 1.46 | 0.18 | 0.89 | 0.11 |
| Zone #3 | 1.30 | 0.70 | 0.39 | 0.14 | 0.74 | 0.26 |

These calculations are based on averages, and calculating total number of faults for all 3 zones based strictly on the number of miles of OH and UG cable results in a total of 5.33 permanent faults. This number might be different from the true number of faults that the feeder had during the previous year(s). As a consequence, the number of faults does not only depend on the number of OH and UG miles of cable, but also it depends on other factors, such as failure of other distribution system devices such as switches, fuses, arresters, transformers, vegetation and loading to name a few. The result is, thus, adjusted later in calculation of customer AOT.

The formula for customer outage time COT in zone i can be approximated as follows:

$$\sum_{c=1}^{c=N_{CZi}} COT_{ci} * p_{Zi} == \sum_{c=1}^{c=N_{CZi}OH} COT_{ci} * p_{Zi} + \sum_{c=1}^{c=N_{CZi}UG} COT_{ci} * p_{Zi} =$$

$$\sum_{c=1}^{c=N_{CZi}OH} p_{OH} * (WTT + CTT + CIT_{OH} + CFFT_{OH}) * p_{Zi} +$$

$$\sum_{c=1}^{c=N_{CZi}UG} p_{UG} * (WTT + CTT + CIT_{UG} + CFFT_{UG}) * p_{Zi}$$

Optimal placement of FCIs on the feeder can reduce CIT, as the number of miles that needs to be patrolled is significantly smaller.

In order to successfully implement the algorithm for optimal placement of FCIs, it is necessary to have historical fault information. This information is easily obtained from the reliability department, if they record the location of the faults. If this information is not available, then an approximated method can be used to predict the highest likelihood of the fault occurrence.

Probability that the fault can occur anywhere on the feeder is not the same, as feeder has some underground cables, some overhead cables, and the area where the feeder is located does not have the same vegetation profile. Note here that other factors can also affect the probability of fault occurrence, but these are the most important ones. In order to estimate the probability of fault occurrence in a particular zone ($p_{Zi}$), the following formula is used:

$$p_{Zi} = c_1 \left( \frac{p_{UG} M_{UGi} + p_{OH} M_{OHi}}{p_{UG} M_{UGZ} + p_{OH} M_{OHZ}} \right) + c_2 \frac{N_{PD\_zi}}{N_{PDZ}}$$

where, $p_{Zi}$—probability of the fault occurrence in a particular zone, $c_1$, $c_2$—constants determined by the utility ($c_1 + c_2 = 1$) that relate to the origin of the fault as described in more detail below, $p_{UG}$—UG cable failure rate, $M_{UG\ i}$—miles of UG cable in the zone i, $p_{OH}$—OH cable failure rate, $M_{OH\ i}$—miles of OH cable in the zone i, $M_{OH\ Z}$—total feeder number of miles of OH cables, $M_{UG\ Z}$—total feeder number of miles of UG cables, $N_{PD\_Zi}$—number of protective devices in zone i, $N_{PD\ Z}$—number of protective devices on the feeder.

Note that based on the causes of failures on a particular feeder, this formula can be expanded in order to include those causes. For example, if the feeder had 10 faults during the year, and 6 of those faults were caused by cable failures, 2 of faults have been caused by protective device failures and 2 of faults have been caused by the distribution transformer failure, the formula is:

$$p_{Zi} = c_1 \left( \frac{p_{UG} M_{UGi} + p_{OH} M_{OHi}}{p_{UG} M_{UGZ} + p_{OH} M_{OHZ}} \right) + c_2 \frac{N_{PD\_zi}}{N_{PDZ}} + c_3 \frac{N_{DT\_zi}}{N_{DTZ}}$$

where, $N_{DT\_zi}$—number of distribution transformers in zone i, $N_{DT\ Z}$—total number of distribution transformers on the feeder, $c_1 = 0.6$, $c_2 = 0.2$, and $c_3 = 0.2$.

Using similar formula, the probabilities that the fault will occur in a particular section within the zone is calculated. In this case, the values are miles of OH and UG cable per section ($M_{UG\ Si}$ and $M_{OH\ Si}$) compared to the total number of miles of OH and UG cable installed in the zone ($M_{UG\ Zi}$ and $M_{OH\ Zi}$). For illustration purposes, the feeder in FIG. 1 had, on an average, 6 faults during the last 5-year period; thus, $c_1 = 1$ and $c_2 = 0$ (as calculated before, total number of faults on the feeder due to OH and UG cable failure was 5.33 and, in this case, the majority of the overall faults on the feeder are caused by the cable, as reflected in the coefficients used):

$$p_{Si} = \frac{p_{UG} M_{UGSi} + p_{OH} M_{OHSi}}{p_{UG} M_{UGZi} + p_{OH} M_{OHZi}}$$

In one embodiment of the method, the random mutation hill climbing (RMHC) approach is utilized. It is contemplated that several other approaches can be used, such as the genetic algorithm (GA), steepest-ascent hill climbing (SAHC) and next-ascent hill climbing (NAHC). The advantage of the RMHC is the performance of the algorithm and time that it takes the GA to reach the optimum solution. The reason for the slower performance of GA algorithms is "hitchhiking". In general, "hitchhiking" limits the implicit parallelism of the GA by restricting the schemas sampled at certain loci. The present invention utilizes the following algorithm for placement of FCIs:

1. Select a feeder CAIDI value for reference, in one preferred embodiment, the value selected is the feeder last 5-year average CAIDI.
2. For each feeder, calculate the number of zones, identify sections in each zone, determine the number of customers per each zone and each section in the zone, the number of miles of a particular conductor in each zone/section, and the type of the cable (OH or UG).
3. Obtain the values for the times associated with initiating a fault ticket, initial drive to the substation, line inspection time and line repair time, these values are preferably obtained from historical data, but may be calculated based on computer simulations for new feeders for which no historical data is available.
4. Determine the coefficients $c_1$, and $c_2$.
5. Calculate $\xi$, such that customer AOT+$\xi$=CAIDI from step 1:

$$\frac{\sum_{i=1}^{i=N_z} \left( \sum_{c=1}^{c=N_{CZi}} COT_{ci} * p_{Zi} \right)}{N_C} + \xi = CAIDI$$

The reason for the formula that includes $\xi$ is because using averages formula for customer AOT does not result in the exact CAIDI value for each feeder as each feeder behaves differently and does not experience the same number of outages and faults;

6. Calculate the values for fault occurrence for each section of each zone by using the formula for $p_a$
7. For each number of desired FCIs on the feeder (1, 2, 3, etc. ...) choose randomly nodes on the feeder where the FCIs are to be placed.
8. Use Monte-Carlo simulation, or any other suitable simulation, in order to simulate faults on the feeder; if the feeder has more than one zone, probabilities of faults occurring in each zone are used as defined by p, noting that:

$$\sum_{i=1}^{N_z} p_{Zi} = 1$$

The simulation protocol is provided below:

a. Randomly generate number f between [0,1];
b. Determine the zone where the fault occurred:
   if $0 \leq f < p_{Z1}$ then the fault occurred in zone 1;
   if $p_{Z1} \leq f < p_{Z2}$ then the fault occurred in zone 2;
   and so on . . .

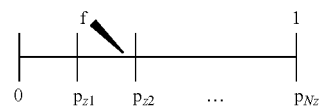

c. within the zone where the fault has occurred, the sum of probabilities of all sections (line between the two nodes) $p_{Si}$ has to be equal 1;
d. Randomly generate number s between [0,1];
e. Based on the feeder configuration, line the values for $p_{Si}$ along the [0,1];
   For example, assume that we have a fault in zone 1 105 (as shown in FIG. 1) below:

The fault probability line would look like the following:

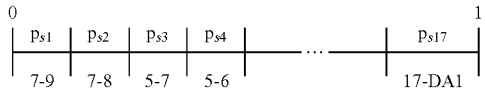

If the FCI is located between the nodes 5 and 7, then it will see all the faults down the line; this means that if the values are $p_{S1}=0.06$, $p_{S2}=0.08$, and $p_{S3}=0.05$ (which are calculated from the $P_i$ formula above utilizing the values from the table of page 9), as long as the random number $s \le (0.06+0.08+0.06)$ or $s \le 0.20$, then FCI will see the fault. However, if $s > 0.20$, then the fault is somewhere upstream, and FCI located between the nodes 5 and 7 will not see it. However, not seeing the fault also reduces the time to locate the fault, as crew line does not need to patrol the feeder downstream from the fault indicator between the nodes 5 and 7.

9. Calculate the mode for AOT based on the Monte-Carlo simulation.
10. Make this a baseline AOT.
11. Define the maximum number of generations as $\binom{n}{k}$, where n is the total number of nodes on the feeder, k is the number of desired sets of FCIs, and the number of generations is representative of the number of ordered sets of FCI's that can be made from a set of nodes of size n.
12. Select a node randomly in a sequence of the FCI placement from step 8.
13. Select another node on the feeder that has no FCI associated with it, place the FCI from the node from step 12 at that node and calculate the new AOT using the same procedure as in steps 8-9.
14. If the new AOT (mode) is lower than the baseline AOT, then make the new AOT the baseline value, and make the new FCI placement as optimum placement.
15. Go back to step 12 until the minimum AOT (mode) has been reached, or until the maximum number of generations has been reached.
16. Change the number of FCIs, and repeat the procedure starting at the step 7.
17. Compare the values for AOT for each number of FCIs installed.
18. Define the desired improvement I [%] in AOT associated with the addition of the extra FCI on the circuit.
19. As long as $AOT_{i-1}/AOT_i > I$, add the additional FCI to the system.

Using this approach faults (step 8) are simulated using Monte Carlo analysis. This approach involves randomly choosing the number between 0 and 1 and identifying if the number is correlated to the section fault probabilities. In an alternative embodiment, approach fault locations from previous years are collected, and probabilities of fault occurrence in the zone/section are calculated from the historical data. Using the historical data approach may result in many sections having zero probability of fault occurrence, which may lead to less accurate placements.

Results for the feeder shown in FIG. 1 with CAIDI average value over 5-year period of 2.87 hrs. are shown in table 2 below:

TABLE 2

RESULTS FOR FEEDER #1

| | # of FCI sets | | | | | |
|---|---|---|---|---|---|---|
| | 0 | 1 | 2 | 3 | 4 | 5 |
| Projected AOT [hr] | 2.47 | 2.14 | 1.88 | 1.67 | 1.54 | 1.51 |
| Projected CAIDI [hr] | 2.87 | 2.54 | 2.28 | 2.07 | 1.94 | 1.91 |
| FCI | | 10-12 | 10-12 | 2-3 | 2-3 | 2-3 |
| | | | 20-21 | 12-14 | 12-14 | 12-14 |
| | | | | 20-21 | 20-21 | 20-21 |
| | | | | | 25-26 | 22-23 |
| | | | | | | 25-26 |

Figure 2:
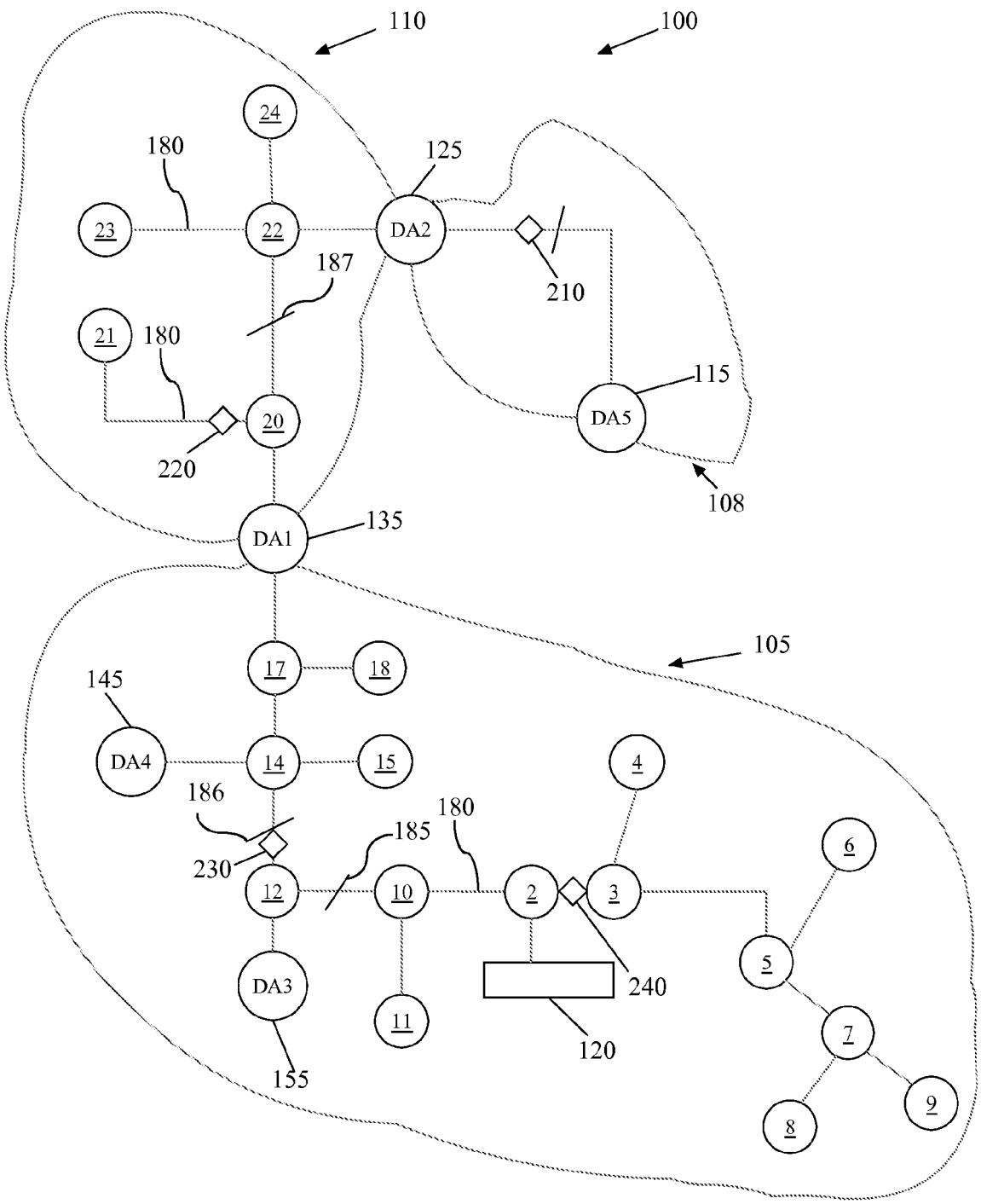
FIG. 2 is a graphical representation of an electrical feeder with FCI's installed.

Note that due to using the average values for overhead and underground cable failures, and average times for inspecting the feeder, our calculated AOT time is 2.47 hours, which results in $\xi=0.4$ hours. As we can see from this analysis, the incremental decrease in customer AOT is significant if 4 sets of FCIs (a set of FCIs includes 3 units—1 per each phase) are installed. However, if a fifth set of FCIs is installed, the incremental improvement for the FCI is only 0.03 hr. Thus, the optimum number of FCI sets that needs to be installed is 4 for this particular feeder. FIG. 2 shows the location of the four FCIs in accordance with this example.

In order for any investment in a new technology/application to make sense, it is necessary to estimate potential benefits of placing a particular number of FCIs on the distribution system. In order to perform the cost-benefit analysis associated with FCIs placement, we used the following process. First, benefits can be divided into two distinct groups:

A. Revenue realized from reduced SAIDI/CAIDI reduction, that would otherwise have been lost without the use of FCIs
B. Cost reduction realized from non-utilization of the distribution line crew, due to the reduced patrol time during the fault location process A. Revenue Increase If the utility does not have FCIs on the distribution network, the utility will lose revenue as long as the customers are without power. However, the use of FCIs reduces the outage time. Our analysis showed that the reduction in patrol time with 4 FCIs on the circuit can reduce the outage duration by at least $T_C=0.93$ hrs. Assuming the average load of $P_C=1.5$ kW/customer, average number of customers per feeder to be $N_C=1000$, price of electricity of $p=0.10\$/kWh$ and cost of generation is $g=0.03/kWh$ the revenue benefit realized per each outage is:

$$\text{Revenue Benefit} = N_C * P_C * T_C * (p-g) = 1000*1.5*0.93*(0.10-0.03) = \$97.65.$$

This value represents the revenue per feeder, per outage, realized by reducing the patrol time by 0.93 hrs. as a result of placements of four sets of FCIs. If the feeder has 10 permanent faults per year, the total additional annual revenue realized is:

$$\text{Annual Revenue Benefit} = 97.65[\$/fault]*10 = \$976.50$$

If the distribution system has 1,000 feeders similar to the feeder characteristics on FIG. 1, the total revenue benefit realized across the whole system is:

$$\text{Total Annual Revenue Benefit} = 1{,}000 \text{ feeders} * \$976.50 = \$976{,}500.$$

Note here that not all the feeders have the same characteristics, but similar methodology can be carried out for each of those feeders.

B. Cost Reduction

Reduction in patrol time associated with fault location automatically reduces the costs associated with distribution line crew. If we assume that the cost of the one man and a truck is $C_{LC}$=$125, then the annual cost reduction per feeder can be calculated as:

$$LCCR = T_C * \# \text{ of faults} * C_{LC} = 0.93 * 10 * \$125 = \$1,162.50$$

For the whole system, annual cost savings are:

$$\text{Total Annual LCCR} = \$1,162.50 * 1000 \text{ feeders} = \$1,162,500$$

Thus, per feeder the total benefit is:

$$\text{Benefit} = \text{Annual Revenue Benefit} + LCCR = \$976.50 + \$1,162.50 = \$2,139$$

The total benefit for the whole system is:

$$\text{Total System Benefit} = \text{Total Annual Revenue Benefit} + \text{Total Annual } LCCR =$$
$$= \$976,500 + \$1,162,500 = \$2,139,000.$$

Second, the cost associated with FCI implementation consists of:
1. Cost per FCI—$600
2. # of FCIs installed per feeder—12
3. Cost of installation—$250 per FCI set (3 total—1 for each phase)
4. Maintenance cost—$125 per feeder Assuming the total lifetime of FCI of 10 years, the annual cost associated with FCI is:

$$\text{Annual FCI Cost} = (\$600 * 12 + \$250 * 4)/10 + \$125 = \$945$$

As can be seen from the analysis above, per feeder, we have realized the benefit of $2,139, by investing $945 in FCI placement on the distribution network. Across the whole system, this amounts to:

$$\text{Net System Savings} = 1,000 \text{ feeders} * \$1,194 = \$1,194,000$$

Another embodiment consists of a computer program product comprising a non-transitory computer readable medium encoding a computer program for executing on a computer system to provide a computer process for maximizing efficient placement of FCIs on an electrical feeder. The computer process executed by the computer system comprises a first step of obtaining a dataset associated with faults in the electric feeder. The data in the data set is stored in databases accessible to the computer system executing the program. A second step consists of processing the data in the data set to identify the number of FCIs and their location on the electrical feeder as described above. The computer program executes the algorithm described in this application, which provides a utility the number of FCIs that reduce customer AOT and the locations within the feeder at which such FCIs are to be placed.

In yet another embodiment, a system for maximizing the efficient placement of FCIs is provided. The system may comprise a data management module configured to store feeder data, and particularly fault related data, a FCI placement module configured to process feeder data and provide the number and location of FCIs for a particular feeder or a zone in the feeder. The data management module may further comprise a plurality of physical databases and drivers, where each driver has access to specific types of data on the database. The system may also include FCIs in communication with the data management module, where the FCIs provide outage related data that may be used in the determining the appropriate number and location of FCIs on the feeder. In some embodiments, the FCIs communicate with the data management module or the utility's back office through cell modem or other long distance communication device as understood by a person having ordinary skill in the art. In other embodiments, the FCIs communicate with a receiver via short ranges radio frequency communications. The receiver then sends the information to the utility's back office either through wireless communication devices or through wired lines connected to a network in communication with the utility. The receiver, in some embodiments, is powered by rechargeable batteries, through solar panels, and other sources of power that allow it to continue to function even when the lines are not receiving power from the feeder system. The system may include other types of devices that provide fault data to the data management module.

As previously described, in some embodiments, the FCIs are deployed as sets with one device for each phase of the system, while on other embodiments single FCIs are deployed. By way of example, in a feeder power is delivered in phases, which may correspond to different parallel lines that are deployed from one utility pole to the next. Each line is a phase and an FCI device is deployed on each phase.

In one embodiment of the present invention, the method is implemented on a computer system with a computer user interface that allows a particular user to identify the number and location of FCI's for a particular feeder as described above. It is contemplated that the user interface, in some embodiments, is a personal computer or work station, a mobile computer, mobile device, a cell phone, a smart phone and any other interface as understood by a person of ordinary skill in the art. In yet a further embodiment, the computer interface is presented through an internet browser. In another embodiment, the computer interface is enabled through an application for a mobile device.

In yet a further embodiment of the present invention, an apparatus is described, wherein said apparatus is configured to determine the location and number of FCIs to be placed on a feeder. The apparatus consists of an interface that enables a user to access the information provided by the apparatus, an storage device configure to store an information data set as described above, a processor configured to perform the method described above and determine the number and location of FCIs on the feeder. It is contemplated that the apparatus can be configured as a handheld device for utility crews to utilize in the field. The apparatus may be further configured to communicate with a network that allows access to information relating to the feeder components and the utility's data.

It will be appreciated by persons skilled in the art that numerous variations and/or modifications may be made to the invention as shown in the specific embodiments, without departing from the spirit or scope of the invention as broadly described. Having now fully set forth the preferred embodiments and certain modifications of the concept underlying the present invention, various other embodiments as well as certain variations and modifications of the embodiments herein shown and described will obviously occur to those skilled in the art upon becoming familiar with said underlying concept. It should be understood that the invention may be practiced otherwise than as specifically set forth herein. The present embodiments are, therefore, to be considered in all respects as illustrative and not restrictive.

What is claimed is:

1. A method for maximizing efficient placement of Fault Circuit Indicators (FCIs) on an electrical feeder, comprising the steps of:
   obtaining a data set associated with faults on an electrical feeder, wherein said data set includes overhead and underground fault response information;
   identifying a number of FCIs and a location of each FCI on the feeder utilizing information contained in the data set, wherein said information comprises at least one of overhead, underground fault response information, and probabilities of overhead and underground faults in the feeder, wherein said number of FCIs and location of each FCI results in a reduction of customer average outage time (AOT) for the feeder, wherein said AOT is determined from the equation:

$$AOT = \frac{\sum_{i=1}^{i=N_Z}\left(\sum_{c=1}^{c=N_{CZi}} COT_{ci} * p_{Zi}\right)}{N_C},$$

wherein
$COT_{ci}$=outage time for customer C in a zone i;
$p_{Zi}$=probability of the fault in the zone i;
$N_Z$=total number of zones;
$N_{CZi}$=total number of customers in zone i; and
$N_C$=total number of customers per feeder; and
wherein said identifying step comprises the steps of:
a. selecting a feeder Customer Average Interruption Duration Index (CAIDI) value for reference;
b. calculating a number of zones for each feeder and identifying sections in each zone, determining number of customers per each zone and each section in the zone, number of miles of a particular conductor in each zone and section, and type of the cable (overhead ("OH") or underground ("UG"));
c. obtaining values for times associated with initiating a fault ticket, initial drive to a substation, line inspection time and line repair time;
d. determining coefficients $c_1$ and $c_2$, wherein $c_1$ and $c_2$ comprise constants that sum to 1 and that correspond to the percent of total faults that comprise faults of a specific origin;
e. calculating $\xi$, such that customer AOT+$\xi$=CAIDI from step a:

$$AOT = \frac{\sum_{i=1}^{i=N_Z}\left(\sum_{c=1}^{c=N_{CZi}} COT_{ci} * p_{Zi}\right)}{N_C} + \xi = CAIDI$$

f. calculating the values for probability of fault occurrence for each section of each zone by using the formula:

$$p_{Zi} = c_1\left(\frac{p_{UG}M_{UGi} + p_{OH}M_{OHi}}{p_{UG}M_{UGz} + p_{OH}M_{OHz}}\right) + c_2\frac{N_{PD\_zi}}{N_{PD\_z}},$$

wherein
$p_{UG}$=percentage of faults on underground cables,
$M_{UGi}$=number of underground cable miles in zone i,
$p_{OH}$=percentage of faults on overhead cables,
$M_{UGz}$=number of overhead cable miles in zone i,
$M_{OHz}$=total feeder number of underground cable miles,
$M_{OHz}$=total feeder number of overhead cable miles,
$N_{PD\_Zi}$=number of protective devices in zone i, and
$N_{PD\_z}$=number of protective devices on the feeder:
g. randomly choosing nodes on the feeder where the FCIs are to be placed:
h. calculating fault probabilities using a simulation algorithm to simulate faults on the feeder;
i. calculating the mode for AOT based on the simulation and making it the baseline AOT;
j. defining the maximum number of generations as $(_k^n)$ where n is the total number of nodes on the feeder, k is the number of desired sets of FCIs, and the number of generations is representative of the number of ordered sets of FCIs that can be made from a set of nodes of size n;
k. selecting a node randomly in a sequence of the FCI placement from step h;
l. selecting another node on the feeder that has no FCI associated with it, place the FCI from the node from step k at that node and calculating the new AOT using the same procedure as in steps h-i;
m. if the new AOT (mode) is lower than the baseline AOT, making the new AOT the baseline value, and selecting the new FCI placement as optimum placement;
n. returning to step k until the minimum AOT (mode) has been reached, or until the maximum number of generations has been reached;
o. changing the number of FCIs, and repeating the procedure starting at the step g
p. comparing the values for AOT for each number of FCIs installed; and
q. selecting the appropriate number and location of FCIs; and placing the identified number of FCIs at the identified locations on the feeder.

2. The method of claim 1, further comprising the step of providing a list of the number of FCIs and the location of each FCI on the feeder.

3. The method of claim 1, wherein the data set comprises:
   historical data for the feeder, and wherein said historical data comprises customer outage time, which comprises at least one of time to initiate a work ticket, time for the line crew to drive to a location on the feeder, time to inspect the feeder, and time to fix a fault, and wherein the customer outage time distinguishes between overhead outage time and underground outage time;
   a Customer Average Interruption Duration Index (CAIDI) reference value;
   a number of permanent outages associated with the feeder, and
   probability constants.

4. The method of claim 1, wherein said identifying step comprises calculating a constant that accounts for different behavior in the feeder.

5. The method of claim 1, wherein said identifying step comprises conducting a simulation of possible faults in the feeder and calculating the AOT of the feeder based on the results of the simulations.

6. The method of claim 5, wherein the simulations follow the Monte-Carlo simulation protocol.

7. The method of claim 1, wherein the number of FCIs results in an optimal AOT.

8. The method of claim 1, wherein the data set is generated randomly.

9. The method of claim 1, further comprising the step of storing the data set on a computer database.

10. The method of claim 1, further comprising the step of defining the desired improvement I [%] in AOT associated with the addition of the extra FCI on the circuit.

11. The method of claim 1, wherein additional FCIs are added as long as $AOT_{i-1}/AOT_i > I$.

12. The method of claim 1, further comprising the step of placing the number of FCIs from the identifying step at the locations identified in the identifying step.

13. A system for maximizing efficient placement of Fault Circuit Indicators (FCIs) on an electrical feeder, comprising:

an electrical feeder forming at least a portion of an electric distribution network;

a data management module configured to store a data set;

a FCI placement module configured to process feeder data and identify a number of FCIs and a location of each FCI on the feeder utilizing information contained in the data set, wherein said information comprises at least one of overhead, underground fault response information, and probabilities of overhead and underground faults in the feeder, wherein said number of FCIs and location of each FCI results in a reduction of customer average outage time (AOT) for the feeder wherein said AOT is determined from the equation:

$$AOT = \frac{\sum_{i=1}^{i=N_z}\left(\sum_{c=1}^{c=N_{CZi}} COT_{ci} * p_{Zi}\right)}{N_C},$$

wherein $COT_{ci}$=outage time for customer C in a zone i;
$p_{Zi}$=probability of the fault in the zone i;
$N_z$=total number of zones;
$N_{CZi}$=total number of customers in zone i; and
$N_C$=total number of customers per feeder; and wherein said identifying step comprises the steps of:

a. selecting a feeder Customer Average Interruption Duration Index (CAIDI) value for reference;

b. calculating a number of zones for each feeder and identifying sections in each zone, determining number of customers per each zone and each section in the zone, number of miles of a particular conductor in each zone and section, and type of the cable (overhead ("OH") or underground ("UG")), c. obtaining values for times associated with initiating a fault ticket, initial drive to a substation, line inspection time and line repair time;

d. determining coefficients $c_1$ and $c_2$, wherein $c_1$ and $c_2$ comprise constants that sum to 1 and that correspond to the percent of total faults that comprise faults of a specific origin;

e. calculating $\xi$, such that customer AOT+$\xi$=CAIDI from step a:

$$AOT = \frac{\sum_{i=1}^{i=N_z}\left(\sum_{c=1}^{c=N_{CZi}} COT_{ci} * p_{Zi}\right)}{N_C} + \xi = CAIDI$$

f. calculating the values for probability of fault occurrence for each section of each zone by using the formula:

$$p_{Zi} = c_1\left(\frac{p_{UG}M_{UGi} + p_{OH}M_{OHi}}{p_{UG}M_{UGz} + p_{OH}M_{OHz}}\right) + c_2\frac{N_{PD\_zi}}{N_{PD\_z}},$$

wherein $p_{UG}$=percentage of faults on underground cables,
$M_{UGi}$=number of underground cable miles in zone i,
$p_{OH}$=percentage of faults on overhead cables,
$M_{UGz}$=number of overhead cable miles in zone i,
$M_{OHz}$=total feeder number of underground cable miles,
$M_{OHz}$=total feeder number of overhead cable miles,
$N_{PD\_zi}$=number of protective devices in zone i, and
$N_{PD\_z}$=number of protective devices on the feeder:

g. randomly choosing nodes on the feeder where the FCIs are to be placed;

h. calculating fault probabilities using a simulation algorithm to simulate faults on the feeder;

i. calculating the mode for AOT based on the simulation and making it the baseline AOT, j. defining the maximum number of generations as $\binom{n}{k}$, where n is the total number of nodes on the feeder, k is the number of desired sets of FCIs, and the number of generations is representative of the number of ordered sets of FCIs that can be made from a set of nodes of size n;

k. selecting a node randomly in a sequence of the FCI placement from step h;

l. selecting another node on the feeder that has no FCI associated with it, place the FCI from the node from step k at that node and calculating the new AOT using the same procedure as in steps h-i;

m. if the new AOT (mode) is lower than the baseline AOT, making the new AOT the baseline value, and selecting the new FCI placement as optimum placement;

n. returning to step k until the minimum AOT (mode) has been reached, or until the maximum number of generations has been reached;

o. changing the number of FCIs, and repeating the procedure starting at step g;

p. comparing the values for AOT for each number of FCIs installed; and q. selecting the appropriate number and location of FCIs; and placing the identified number of FCIs at the identified locations on the feeder.

14. The system of claim 13, further comprising the step of providing a list of the number of FCIs and the location of each FCI on the feeder.

15. The system of claim 13, wherein the data set comprises:
historical data for the feeder, and wherein said historical data comprises customer outage time, which comprises at least one of time to initiate a work ticket, time for the line crew to drive to a location on the feeder, time to inspect the feeder, and time to fix a fault, and wherein the customer outage time distinguishes between overhead outage time and underground outage time;
a Customer Average Interruption Duration Index (CAIDI) reference value;
a number of permanent outages associated with the feeder, and
probability constants.

16. The system of claim 13, wherein said identifying step comprises calculating a constant that accounts for different behavior in the feeder.

17. The system of claim 13, wherein said identifying step comprises conducting a simulation of possible faults in the feeder and calculating the AOT of the feeder based on the results of the simulations.

18. The system of claim 17, wherein the simulations follow the Monte-Carlo simulation protocol.

19. The system of claim 13, wherein the number of FCIs results in an optimal AOT.

20. The system of claim 13, wherein the data set is generated randomly.

21. The system of claim 13, further comprising the step of storing the data set on a computer database.

22. The system of claim 13, further comprising the step of defining the desired improvement I [%] in AOT associated with the addition of the extra FCI on the circuit.

23. The system of claim 13, wherein additional FCIs are added as long as $AOT_{i-1}/AOT_i > I$.

24. The system of claim 13, further comprising the step of placing the number of FCIs from the identifying step at the locations identified in the identifying step.

25. The system of claim 13, further comprising at least one set of FCIs.

26. The system of claim 25, wherein the FCI's are capable of communicating with a utility's back office.

\* \* \* \* \*